(12) United States Patent
Han et al.

(10) Patent No.: US 7,688,492 B2
(45) Date of Patent: Mar. 30, 2010

(54) LASER PROCESSING APPARATUS

(75) Inventors: You-Hi Han, Daejeon (KR); Eun-Jeong Hong, Gyeonggi-do (KR); Hak-Yong Lee, Seoul (KR); Won-Chul Jung, Gyeonggi-do (KR)

(73) Assignee: Eo Technics Co., Ltd., Gyeonggi-do (KR)

( * ) Notice: Subject to any disclaimer, the term of this patent is extended or adjusted under 35 U.S.C. 154(b) by 61 days.

(21) Appl. No.: 11/578,373

(22) PCT Filed: Jun. 2, 2004

(86) PCT No.: PCT/KR2004/001315

§ 371 (c)(1),
(2), (4) Date: Sep. 27, 2007

(87) PCT Pub. No.: WO2005/101487

PCT Pub. Date: Oct. 27, 2005

(65) Prior Publication Data

US 2008/0088900 A1 Apr. 17, 2008

(30) Foreign Application Priority Data

Apr. 19, 2004 (KR) .................. 10-2004-0026749

(51) Int. Cl.
*G02B 26/08* (2006.01)
(52) U.S. Cl. .................................. 359/226.1
(58) Field of Classification Search ............... 359/212, 359/226
See application file for complete search history.

(56) References Cited

U.S. PATENT DOCUMENTS

| | | | |
|---|---|---|---|
| 4,662,708 A | 5/1987 | Bagdal | |
| 5,397,327 A | 3/1995 | Koop et al. | |
| 5,670,069 A | 9/1997 | Nakai et al. | |
| 5,708,252 A | 1/1998 | Shinohara et al. | |
| 6,437,284 B1 | 8/2002 | Okamoto et al. | |
| 6,468,842 B2* | 10/2002 | Yamazaki et al. | 438/487 |
| 6,492,616 B1 | 12/2002 | Tanaka et al. | |
| 7,208,395 B2* | 4/2007 | Shimomura et al. | 438/487 |

(Continued)

FOREIGN PATENT DOCUMENTS

JP 62-043620 2/1987

(Continued)

*Primary Examiner*—Euncha P Cherry
(74) *Attorney, Agent, or Firm*—Venable LLP; Jeffri A. Kaminski

(57) ABSTRACT

Disclosed is a laser processing apparatus for minimizing generation of sludge and enhancing the processing efficiency while processing an object. The laser processing apparatus includes a beam irradiator for emitting a laser beam from a laser light source, a beam scanner for operating the laser beam emitted from the beam scanner, to be irradiated on a predetermined interval of a processing position of the object repeatedly on the straight, and a condensing lens for regulating a focus of the laser beam emitted from the beam irradiator. The object is movable at least once along a processing direction during processing the object. According to the present invention, it is able to improve the processing efficiency and to work an object with a uniform morphology by using a mask filtering a laser beam irradiated at a rotation turning point of a beam scanning mirror, capable of continuously irradiating a laser beam by deforming the laser beam into an elliptical pattern.

11 Claims, 9 Drawing Sheets

U.S. PATENT DOCUMENTS

2003/0168437 A1    9/2003    Tanaka

FOREIGN PATENT DOCUMENTS

| | | |
|---|---|---|
| JP | 01-224193 | 9/1989 |
| JP | 02-041784 | 2/1990 |
| JP | 02-137687 | 5/1990 |
| JP | 07-100670 | 4/1995 |
| JP | 07-148583 | 6/1995 |
| JP | 08-272104 | 10/1996 |
| JP | 10-034365 | 2/1998 |
| JP | 10-052781 | 2/1998 |
| JP | 10-200269 | 7/1998 |
| JP | 10-242617 | 9/1998 |
| JP | 11-151584 | 6/1999 |
| JP | 11-156567 | 6/1999 |
| JP | 11-333575 | 12/1999 |
| JP | 12-001178 | 1/2001 |
| JP | 13-079678 | 3/2001 |
| JP | 14-045985 | 2/2002 |
| JP | 2002-045985 | 2/2002 |
| JP | 14-184307 | 6/2002 |
| JP | 14-239772 | 8/2002 |
| JP | 2003-045820 | 2/2003 |
| JP | 15-117676 | 4/2003 |
| JP | 15-218058 | 7/2003 |
| JP | 15-224083 | 8/2003 |
| JP | 16-039890 | 2/2004 |
| JP | 16-90062 | 3/2004 |
| JP | 16-098087 | 3/2004 |
| JP | 2004-090062 | 3/2004 |
| JP | 16-193592 | 7/2004 |
| WO | WO-00/53365 | 9/2000 |

* cited by examiner

LASER PROCESSING APPARATUS

TECHNICAL FIELD

The present invention relates to an object processing apparatus, and more particularly, to a laser processing apparatus for minimizing generation of sludge and enhancing the processing efficiency while processing an object like a wafer.

BACKGROUND ART

In producing objective materials from wafers, metals, plastics, and so on, it is general to operate processing procedures such as cutting and grooving works. For instance, after completing a semiconductor chip fabrication process, a process for cutting a wafer to separate plural chips, which are formed on the wafer, into individual chips is subsequent thereto. The wafer cutout operation is very important over the whole process of semiconductor chips because it heavily affects the productivity and product quality in the subsequent process. The wafer cutout operation is usually carried out with a mechanical cutout method or a method employing a laser beam.

In a mechanical processing apparatus such as a sawing device, after mounting a wafer on a stage, a cutting blade of the sawing device contacts to a cutting position (i.e., street), with rotating in a predetermined speed, and then severs (or cuts out) the wafer into unit chips. During this, the sludge generated by the wafer cutting operation is removed therefrom by ejecting a cleaner thereto. However, when a wafer is severed by means of the mechanical processing method, it is impossible to completely remove the sludge by a cleaner and inevitable to be operable with a wider cutout breath. Especially, when it needs to sever a wafer in a relatively smaller size, the wider cutout breath may cause damages on circuits formed in the wafer. Even with a way to overcome the problem by adjusting an edge width of the blade, there is a limit to narrow the edge width of the blade.

Recently, it has been studied a technique of processing a wafer in the manner of non-contactable form with a laser beam. In order to conduct a wafer by means of a laser beam, after settling a substrate support, on which a wafer is mounted, on a transfer unit, a laser beam emitted from a light source is transmitted through a condensing lens and then irradiated on the wafer.

The processing method with a laser beam uses a mechanism of burning irradiated areas out of the wafer due to inducing effects of heating and chemistry by focusing the laser beam on a surface of the wafer in the range of ultraviolet rays 250~360 nm. In other words, when a laser beam is condensed and irradiated on a wafer, the irradiated area is heat up instantly and then evaporated, as well as being melted, to increase a vaporizing pressure according to the evaporation of the wafer material, resulting in an explosive burning-out of the irradiated area. From a successive sequence of the burning-out operations, a wafer can be divided into multiple chips and a linear or curved severing process is available therein.

However, even in the processing method with a laser beam, it is also impossible to clearly remove the sludge therefrom such as in the mechanical sawing method. Further, it has disadvantages that the sludgy particles vaporized or evaporated by the irradiation of a laser beam are condensed and recasted on sidewalls of a wafer, without being discharged outside, as a recess depth of a processing plane.

Moreover, the laser processing method currently used is workable with transferring an object only or a laser beam irradiator. This is inefficient to carry out a mass-production process such as a multi-pass cutting operation, and needs to assure the stability of a transfer unit to move an object in a high speed, which causes an apparatus heavier and a product cost higher.

DISCLOSURE OF INVENTION

An object of the present invention is directed to provide a laser processing apparatus for enhancing the efficiency of processing an object by transferring the object while irradiating a laser beam on the object, as well as transferring the laser beam along a processing direction, during processing the object.

Another object of the present invention is to provide a laser processing apparatus for processing working areas all in uniform morphology while irradiating a laser beam with being transferred along a processing direction.

Still another object of the present invention is to provide a laser processing apparatus for improving the performance and processing speed by minimizing a distance between adjacent spots of a laser beam irradiated on a processing object.

In order to accomplish the above objects of the present invention, a laser processing apparatus for processing an object by laser is comprised of a beam irradiator for emitting a laser beam from a laser light source, a beam scanner for operating the laser beam emitted from the beam irradiator, to be irradiated on a predetermined interval of a processing position of the object repeatedly on the straight, and a lens for condensing the laser beam emitted from the beam scanner. The object is transferred at least once along a processing direction while processing the object.

BEST MODE FOR CARRYING OUT THE INVENTION

Hereinafter, preferred embodiments of the present invention will now be described below in more detail with reference to the accompanying drawings.

Figure 1:
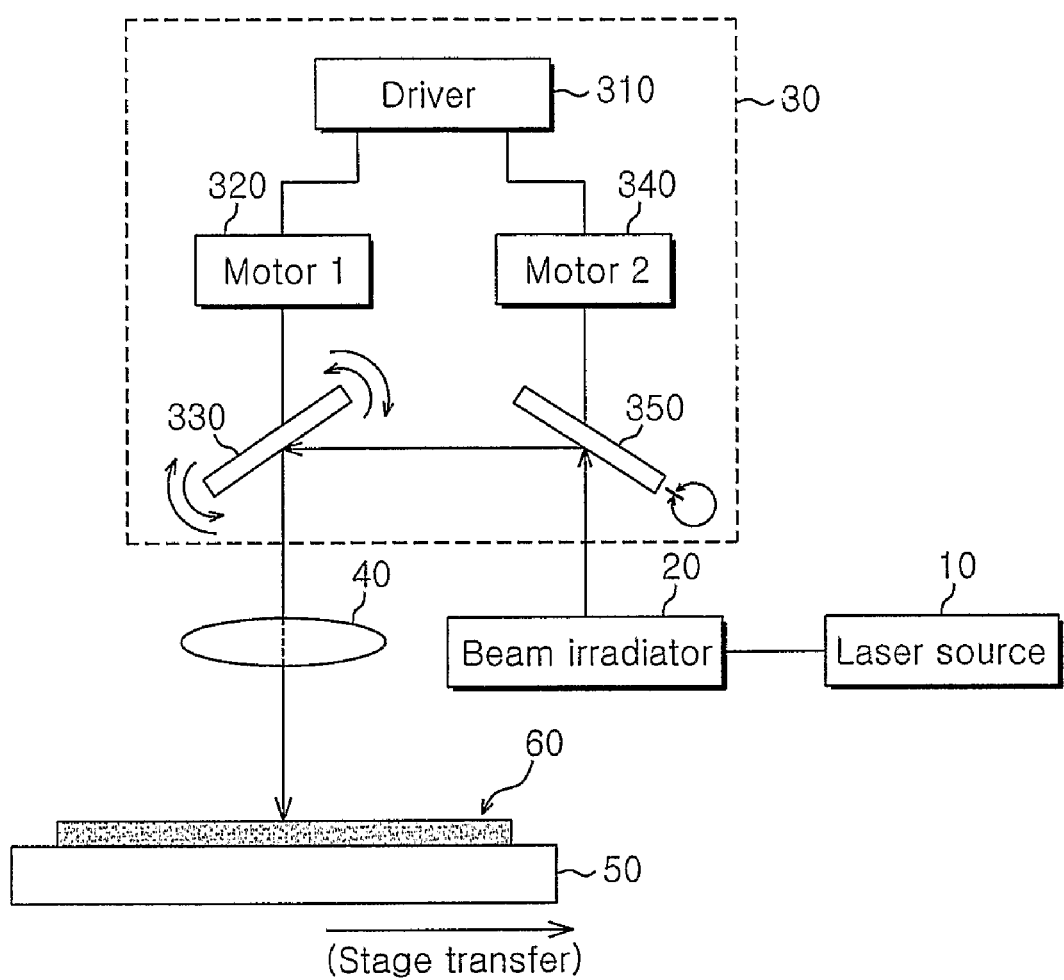
FIG. 1 is a structural diagram illustrating a laser processing apparatus according to a first embodiment of the present invention.

FIG. 1 is a structural diagram illustrating a laser processing apparatus according to a first embodiment of the present invention.

The laser processing apparatus of the present invention includes a laser light source 10, a beam irradiator 20 for emitting a laser beam from a laser light source, a beam scanner 30 for operating the laser beam emitted from the beam irradiator 20, to be irradiated on a predetermined interval of a processing position of the object repeatedly on the straight, and a condensing lens 40 for regulating a focus of the laser beam emitted from the beam scanner 30.

Here, the beam scanner 30 can be implemented with a galvanometer scanner or a servomotor. The beam scanner 30 includes a driver 310, one or a couple of motors 320 and 340 actuated by the driver 310, one or a pair of mirrors 330 and 350 being connected respective to rotation axes of the motors 320 and 340 and repeatedly rotating along a predetermined angle and direction (left and right, or up and down). In the structure of the laser processing apparatus, according to rotation of the mirrors 330 and 350 of the beam scanner 30, a laser beam is transferred along a processing direction to be effectively irradiated on a processing object.

In the embodiment of the present invention, with irradiating a laser beam, an object 60 mounted on a stage 50 is transferred at least once by means of a transfer unit (not shown). In the condition that a spot size of the laser beam for processing an object is 20 μm with a frequency of 40~50 KHz, if a transfer speed of the object 60 is too fast when the laser beam is being irradiated on the object 60, which is moving, by the rotating mirrors 330 and 350, a recessing depth of the object 60 becomes shallower. Therefore, it is required to set the object 60 to be transferred only once during the entire processing time.

Now, a way of severing the object by the laser processing apparatus is as follows. A laser beam incident on the second mirror 350 through the beam irradiator 20 from the laser light source 10 is reflected on the first mirror 330. And then, the laser beam reflected on the first mirror 330 is condensed on the lens 40. The condensing lens 40 applies the laser beam to the object 60 with a regularized focus. Here, the mirrors 330 and 350 are utilized with one of them or altogether.

During the procedure, it can obtain an effect of mobile irradiation with the laser beam because the first and second mirrors 330 and 350 rotate along a predetermined angle and direction. In addition, a processing time can be shortened because the object 60 is also transferred along the processing line, and it is possible to lessen a product cost and weight of the apparatus because there is no need of a transfer unit that must be designed with its stability of operation.

From the operation feature of the laser beam processing apparatus in which a laser beam is irradiated on a wafer, which is transferred at least once, by the mirror of the beam scanner rotating multiple times, it may be called as a hybrid-driving laser processing apparatus.

FIGS. 2A through 2D are schematic diagrams illustrating the features of repeatedly irradiating a laser beam on an object by the laser processing apparatus shown in FIG. 1, assuming that an object is fixed at a stage in convenience of description.

As illustrated, it can be seen that a position that the laser beam is irradiated on the object is variable as the mirror 330 is being inclined along the processing sequence shown from FIG. 2A to FIG. 2D. Since the laser beam is continuously emitted and the mirror 330 rotates successively, the laser beam is irradiated on the processing plane of the object 60 on a straight direction and thereby the surface of the object 60 is continuously cut out on the straight (100, 102, and 104).

Figure 2A:
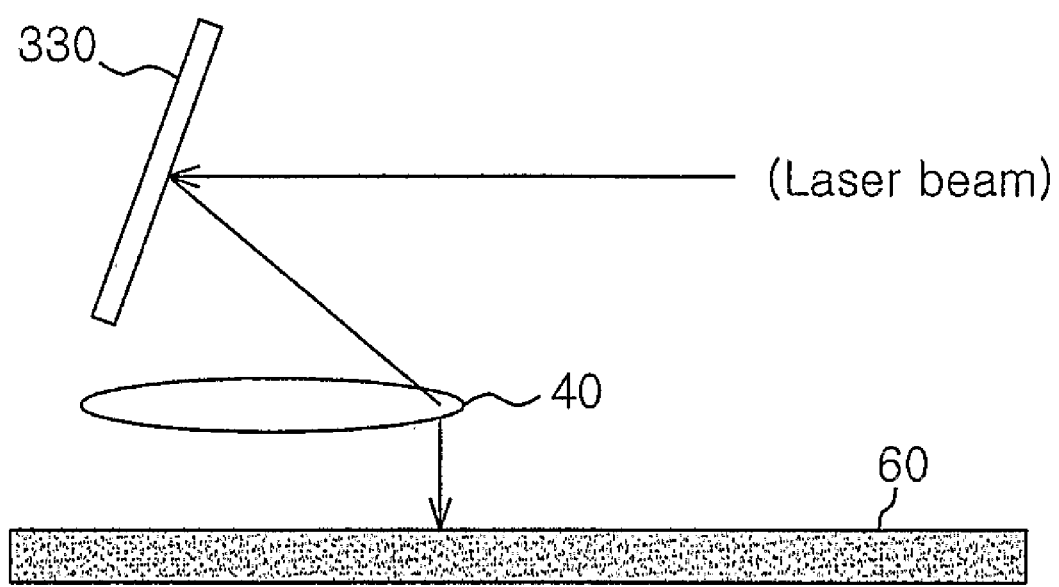
FIGS. 2A through 2D are schematic diagrams illustrating the features of repeatedly irradiating a laser beam on an object by the laser processing apparatus shown in FIG. 1.
Figure 2B:
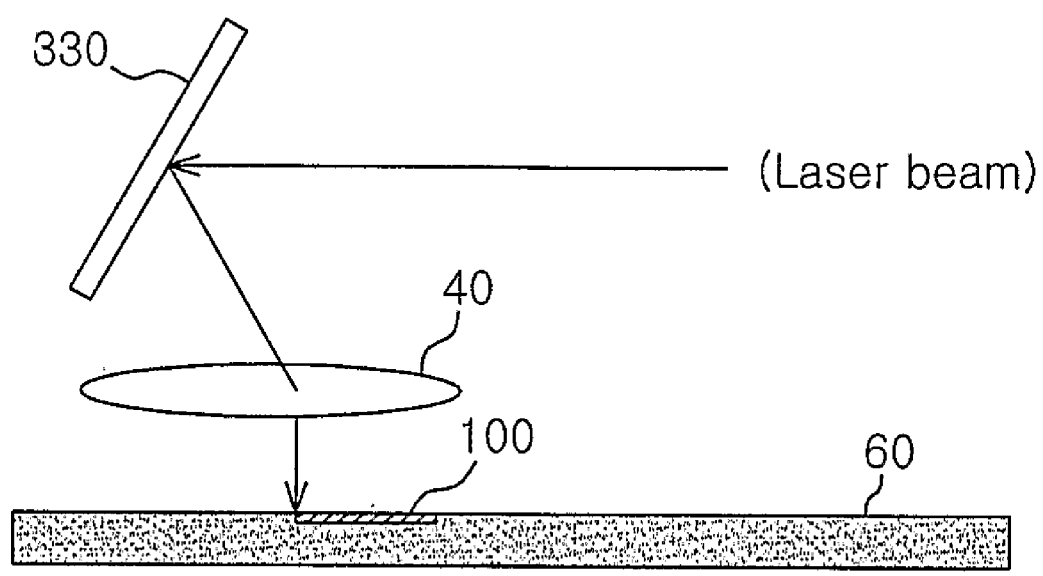
Figure 2C:
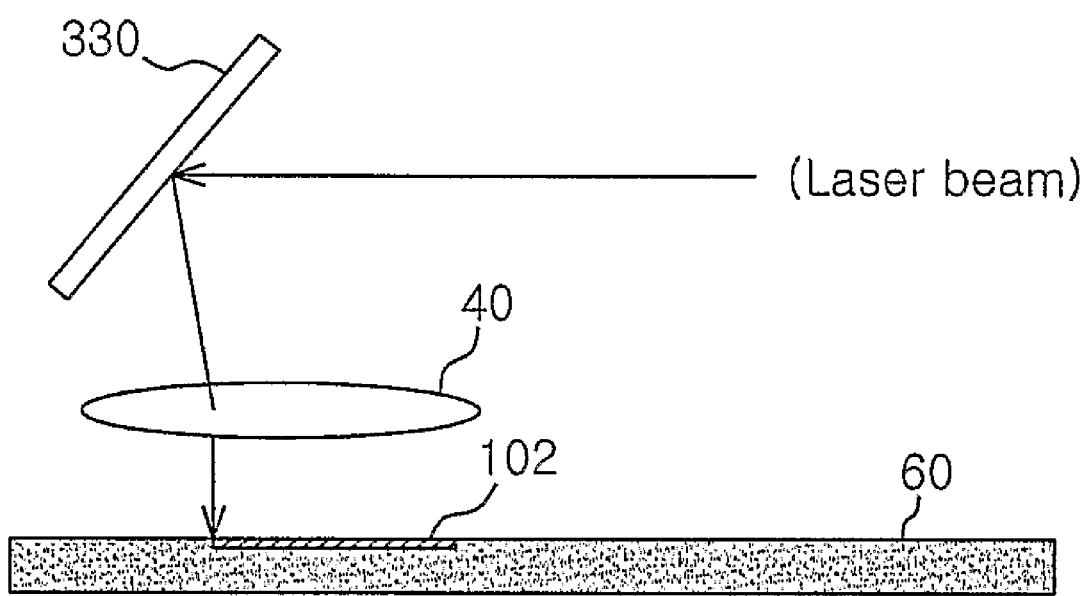
Figure 2D:
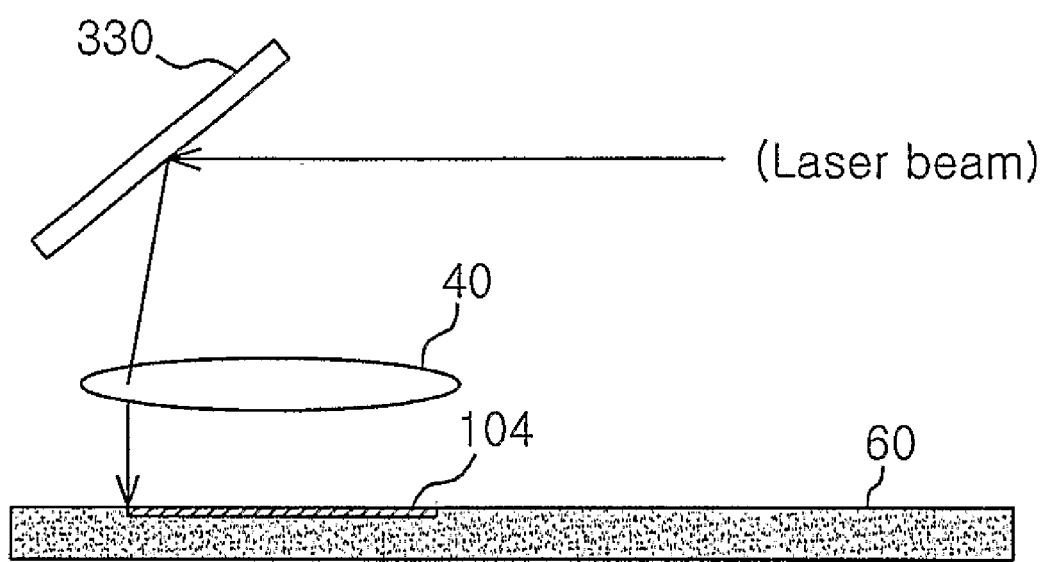

After moving to a predetermined angle by rotation, the mirror 330 reversely rotates along the direction from the position of FIG. 2D to the position of FIG. 2A. As a result, the processing efficiency can be improved by operating the shuttle irradiation of the laser beam on the processing plane of the object 60.

Figure 3:
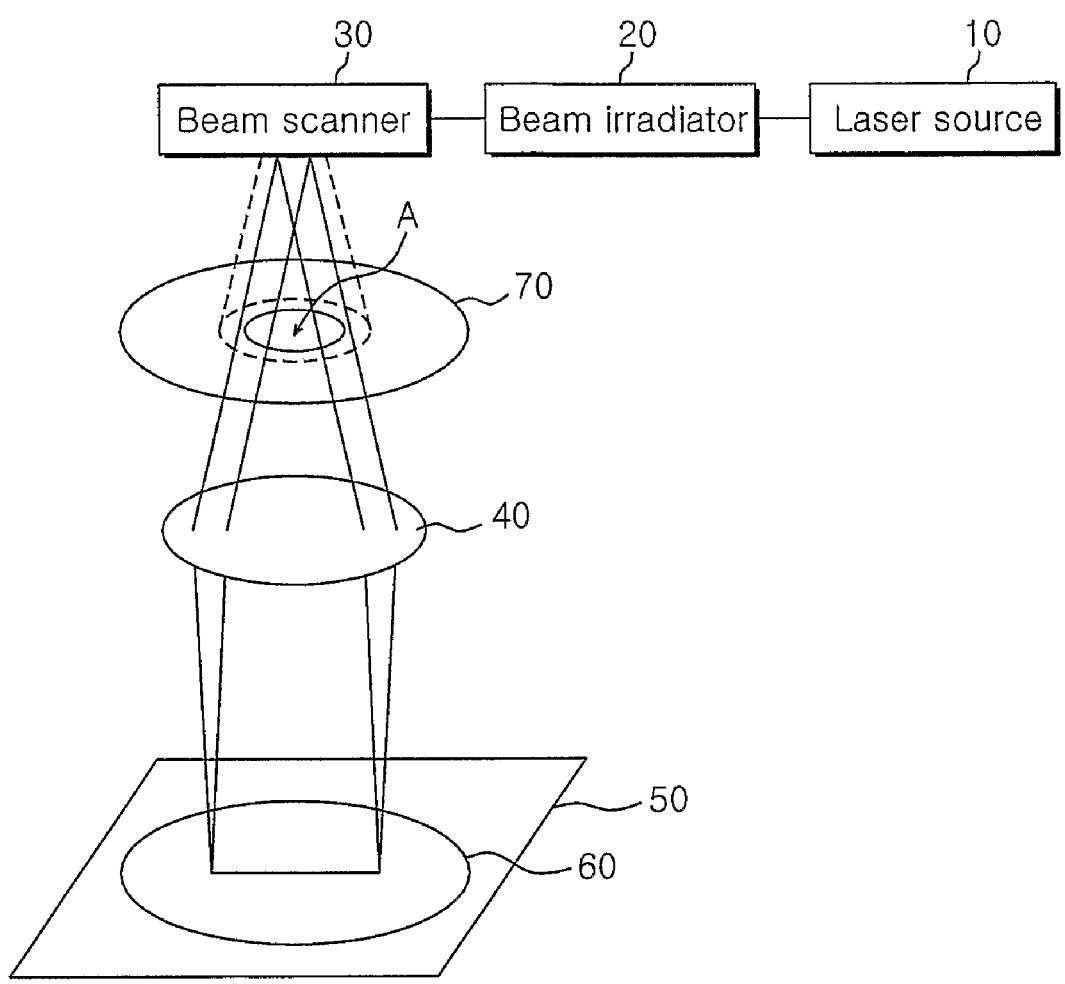
FIG. 3 is a structural diagram of a laser processing apparatus with a mask in accordance with a second embodiment of the present invention.

FIG. 3 is a structural diagram of a laser processing apparatus with a mask in accordance with a second embodiment of the present invention.

The laser processing apparatus illustrated in FIG. 1 is advantageous to enhancing the processing efficiency and reducing a cost of apparatus by processing an object with the hybrid operation as aforementioned. But, since a laser beam is irradiated on the object, without moving, at a rotational turning point while repeating the rotation of the beam scanner 30 in a predetermined angle, it may cause a phenomenon that an area processed at the tuning point of the laser beam is recessed deeper than other areas, degrading the uniformity of processing.

This embodiment, as a second embodiment of the present invention, provides a laser processing apparatus to overcome such shortness of the processing uniformity of an object at the turning point of rotation of the mirror, being associated with a mask.

Referring to FIG. 3, the laser processing apparatus of the present invention includes the laser light source 10, the beam irradiator 20 for emitting a laser beam from a laser light source, the beam scanner 30 for operating the laser beam emitted from the beam irradiator 20, to be irradiated on a predetermined interval of a processing position of the object repeatedly on the straight, a mask 70 having a hole A for filtering the laser beam emitted from a rotational turning point of the mirror 330 when the laser beam is emitted from the beam scanner 30, and the condensing lens 40 for regulating a focus of the laser beam emitted from the mask 70.

Here, the mask 70 can be interposed between the beam scanner 30 and the condensing lens 40 or between the condensing lens 40 and the object 60, and made from a material capable of reflecting such as a metal or absorbing a laser beam.

In the laser processing apparatus shown in FIG. 3, a laser beam emitted from the mirror of the beam scanner 30 at the rotational returning point is irradiated and reflected around the hole A of the mask 70 and after passing through the hole A, the laser beam is uniformly applied to the object without any position moving in the speed of 0. In other words, the mask 70 used in the second embodiment acts to make a laser beam be reflected at the rotational turning point where a transfer speed of the mirrors 330 and 350 of the beam scanner 30 stands on zero.

Figure 4:
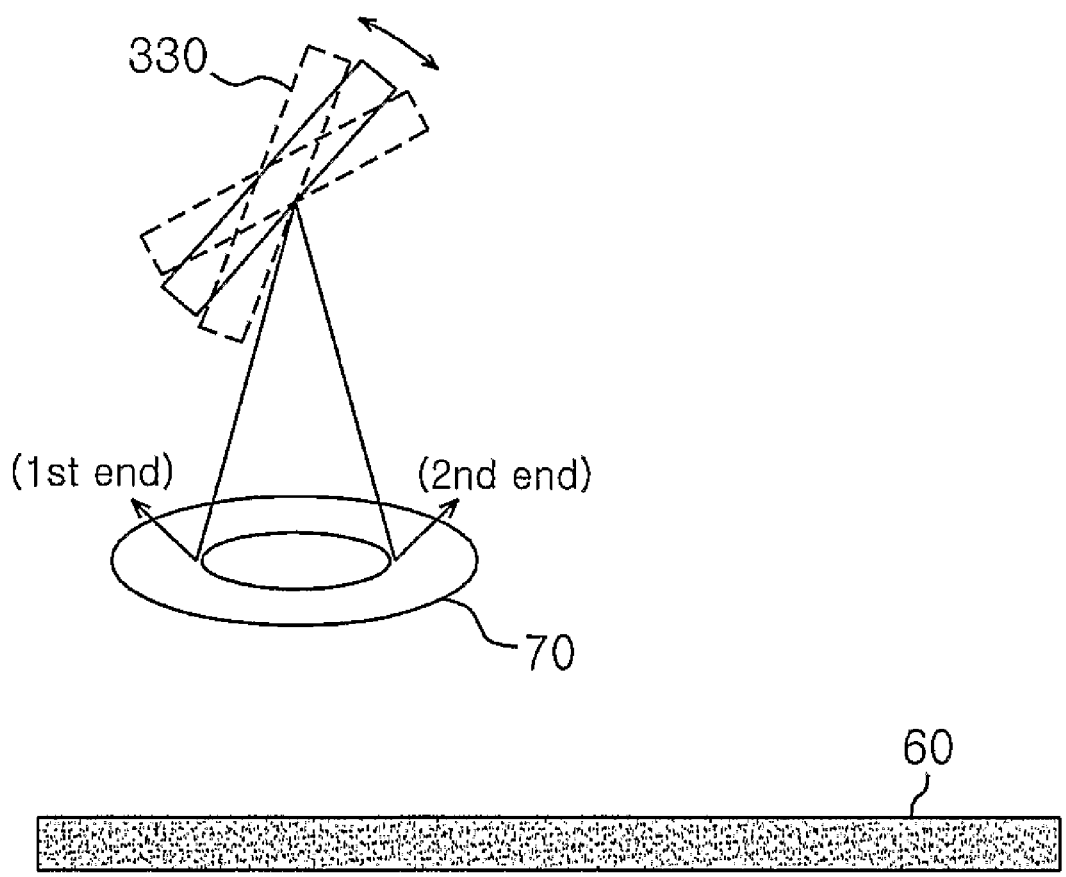
FIG. 4 is a schematic diagram for illustrating the feature of uniformly processing a surface of an object by the laser processing apparatus shown in FIG. 3.

FIG. 4 is a schematic diagram for illustrating the feature of uniformly processing a surface of the object by the laser processing apparatus shown in FIG. 3.

As illustrated in FIG. 4, as a transfer speed becomes zero at first and seconds ends to turn a transfer direction of the mirror 330 while rotating, laser beams emitted from the first and second ends are filtered by the mask 70 with the hole A in order to prevent the laser beam from being excessively irradiated on a processing plane of the object.

The mask 70 is changeable with another among the plurality of them manufactured in various sizes, in accordance with an irradiation width of the laser beam. If a size of the hole A of the mask 70 is constant, an irradiation width of the laser beam can be adjusted by taking the mask 70 up or down to filter the laser beam emitted from the rotational turning point of the mirror. Although when it is impossible to change or move the mask 70, an irradiation width of the laser beam can be adjustable by controlling rotation angles of the mirrors 330 and 350 of the beam scanner 30.

Figure 5:
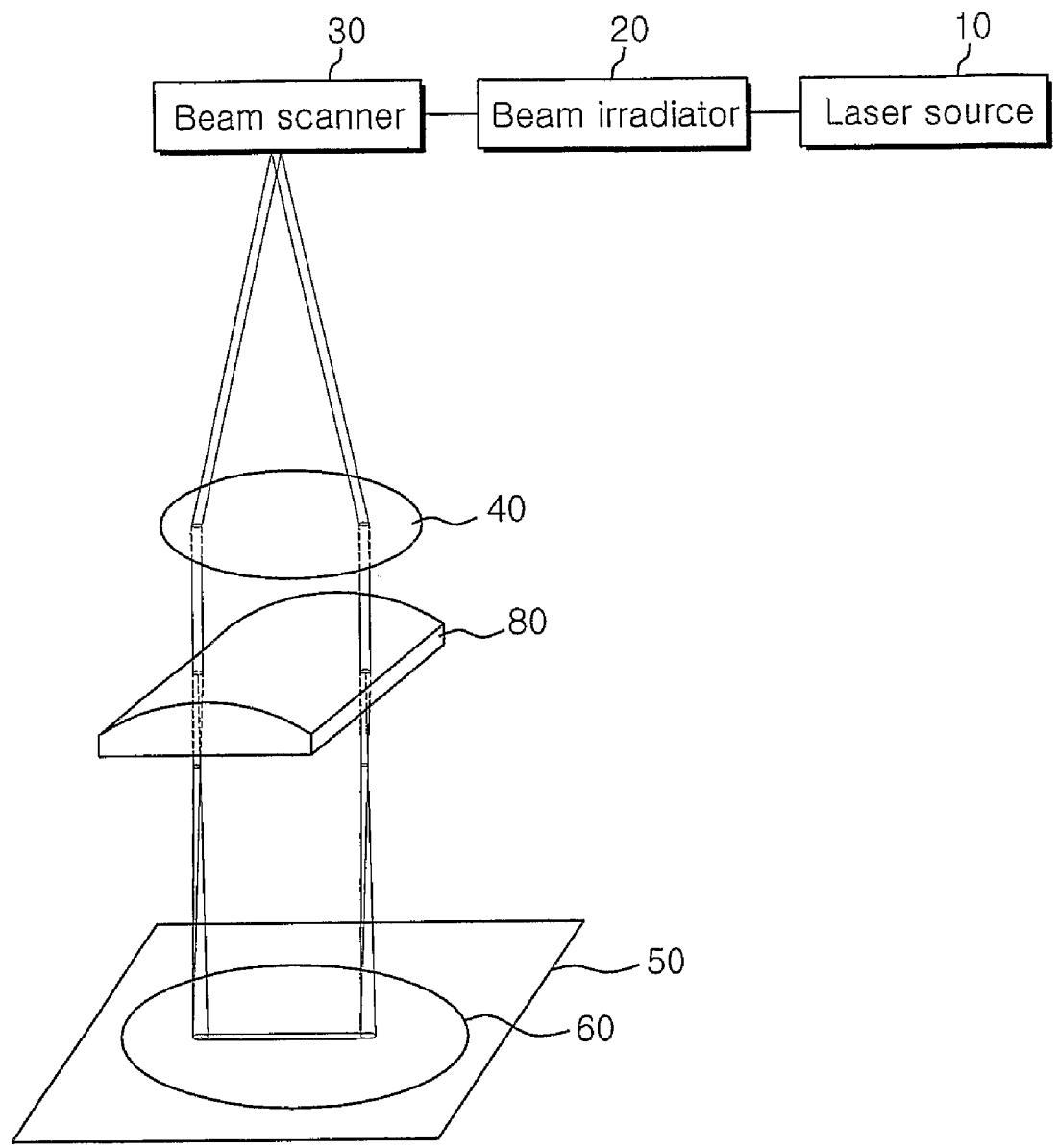
FIG. 5 is a structural diagram of a laser processing apparatus with a deforming lens in accordance with a third embodiment of the present invention.

FIG. 5 is a structural diagram of a laser processing apparatus with a deforming lens in accordance with a third embodiment of the present invention.

As aforementioned, while the laser processing apparatus shown in FIG. 1 is advantageous to enhancing the processing efficiency and reducing a cost of apparatus by processing an object with the hybrid operation, it may cause degradation of the processing efficiency by discontinuous irradiation of a laser beam on a processing area of the object 60 because the laser beam is irradiated, with moving, by the beam scanner 30 and the condensing lens 40 on the object 60.

This embodiment, as a third embodiment of the present invention, provides a laser processing apparatus to overcome such discontinuous irradiation of the laser beam on a processing plane of an object, being associated with an elliptical deforming lens.

Referring to FIG. 5, the laser processing apparatus according to the third embodiment of the present invention includes the laser light source 10, the beam irradiator 20 for emitting a laser beam from a laser light source, the beam scanner 30 for operating the laser beam emitted from the beam irradiator 20, to be irradiated on a predetermined interval of a processing position of the object repeatedly on the straight, the condensing lens 40 for regulating a focus of the laser beam emitted from the beam scanner 30, and a deforming lens 80 for transforming a spot of the laser beam reflected on the condensing lens 40 into an elliptical pattern.

The deforming lens 80 is preferred to be implemented with a cylindrical lens and needs to have topological pattern to make a processing direction of the object 60 be concordant with a long diameter of the elliptical spot of the laser beam.

That is, a laser beam with a circular spot emitted from the condensing lens 40 is transformed into an elliptical spot by the deforming lens 80 and then irradiated on the object 60, so that it is effective in accomplishing continuous irradiation due to eliminating or reducing intervals between adjacent laser beam spots.

Figure 6:
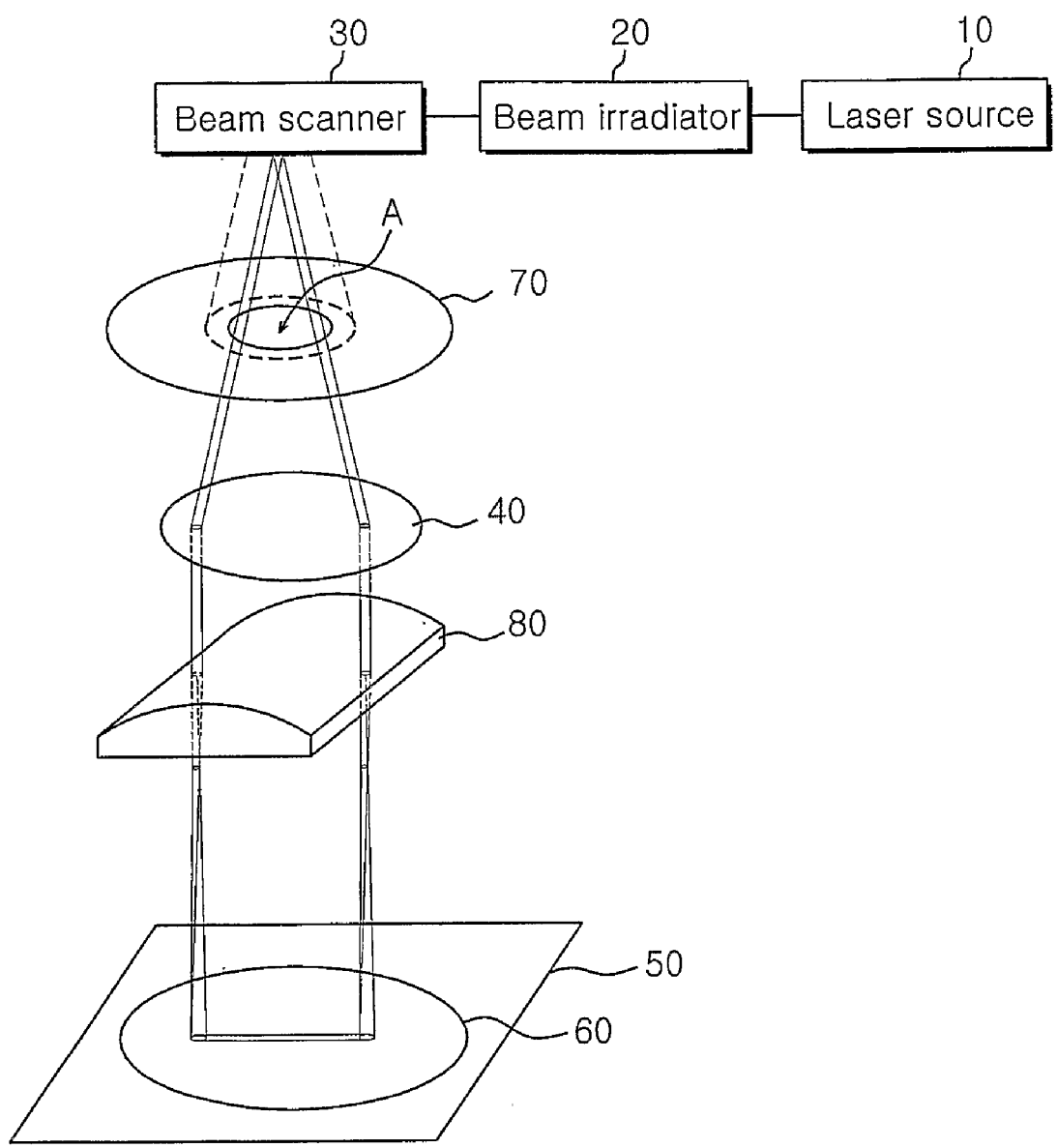
FIG. 6 is a structural diagram of a laser processing apparatus with the mask and the deforming lens in accordance with a fourth embodiment of the present invention.

FIG. 6 is a structural diagram of a laser processing apparatus with the mask and the deforming lens in accordance with a fourth embodiment of the present invention.

Referring to FIG. 6, the laser processing apparatus according to the fourth embodiment of the present invention includes the laser light source 10, the beam irradiator 20 for emitting a laser beam from a laser light source, the beam scanner 30 for operating the laser beam emitted from the beam irradiator, to be irradiated on a predetermined interval of a processing position of the object repeatedly on the straight, a mask 70 having a hole A for filtering the laser beam emitted from a rotational turning point of the mirror 330 when the laser beam is emitted from the beam scanner 30, the condensing lens 40 for regulating a focus of the laser beam emitted from the mask 70, and the deforming lens 80 for transforming a spot of the laser beam reflected on the condensing lens 40 into an elliptical pattern.

Here, the mask 70 can be interposed between the beam scanner 30 and the condensing lens 40 or between the condensing lens 40 and the object 60, and made from a material capable of reflecting such as a metal or absorbing a laser beam.

The mask 70 is changeable with another among the plurality of them manufactured in various sizes of the hole A, in accordance with an irradiation width of the laser beam. If a size of the hole A of the mask 70 is constant, an irradiation width of the laser beam can be adjusted by taking the mask 70 up or down to filter the laser beam emitted from the rotational turning point of the mirror. Although it is impossible to change or move the mask 70, an irradiation width of the laser beam can be adjustable by controlling rotation angles of the mirrors 330 and 350 of the beam scanner 30.

The deforming lens 80 is preferred to be implemented with a cylindrical lens and needs to have topological pattern to make a processing direction of the object 60 be concordant with a long diameter of the elliptical spot of the laser beam.

In the laser processing apparatus shown in FIG. 6, a laser beam emitted from the mirror of the beam scanner 30 at the rotational tuning point is irradiated and reflected around the hole A of the mask 70, and after passing through the hole A, the laser beam is uniformly applied to the object without any position moving in the speed of 0. Further a laser beam with a circular spot emitted from the condensing lens 40 is transformed into an elliptical spot by the deforming lens 80 and then irradiated on the object 60, so that it is effective in accomplishing continuous irradiation due to eliminating or reducing intervals between adjacent laser beam spots.

According to the embodiments of the present invention, the laser processing apparatus of the present invention is advantageous to improving the efficiency of operating a process of severing or grooving an object such as a wafer, a metal, or a plastic with a laser beam, by processing the object with the hybrid operation in which the laser beam is irradiated, with moving, on a wafer which is transferred at least once.

Further, the present invention is effective in preventing an irregular processing result of an object due to irradiation of a laser beam at the rotational turning point by using the mask filtering the laser beam emitted from the rotational turning point, among laser beams emitted from the mirror of the beam scanner that irradiates the laser beam with transfer.

Moreover, the present invention provides a laser processing apparatus to overcome discontinuous irradiation of the laser beam on a processing plane of an object, due to the sequence with a contemporaneous transfer of the laser beam and the object, by irradiating the laser beam with an elliptical spot while a long diameter of the elliptical spot is being concordant with a processing direction of the object.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

INDUSTRIAL APPLICABILITY

The present invention is applicable to a laser processing apparatus for severing and grooving an object such as a semiconductor wafer, a metal, or a plastic, by means of a laser beam.

What is claimed is:

1. A laser processing apparatus for processing an object by laser, comprising:

a beam irradiator for emitting a laser beam from a laser light source;

a beam scanner for operating the laser beam, which is emitted from the beam irradiator, to be irradiated on a predetermined interval of a processing position of the object repeatedly on the straight;

a condensing lens for condensing the laser beam emitted from the beam scanner; and a mask including a hole for passing or reflecting the laser beam, wherein the object is transferred at least once along a processing direction while processing the object and the mask passes the laser beam emitted from a mirror of the beam scanner through the hole, and reflects the laser beam emitted from a rotational turning point of the mirror of the beam scanner around the hole before the laser beam emitted from the beam scanner is irradiated on the object.

2. The laser processing apparatus according to claim 1, wherein the beam scanner comprises:
   a driver;
   a motor actuated by the driver; and
   a mirror connected to a rotation axis of the motor and repeatedly rotating along a predetermined angle and direction.

3. The laser processing apparatus according to claim 1, wherein the beam scanner comprises:
   a driver;
   a couple of motors actuated by the driver; and
   first and second mirrors connected respective to rotation axes of the motors and repeatedly rotating along a predetermined angle and direction.

4. The laser processing apparatus according to claim 1, wherein the mask reflects the laser beam emitted from the rotational turning point of the mirror of the beam scanner, among laser beams emitted from the condensing lens before the laser beam emitted from the condensing lens is irradiated on the object.

5. The laser processing apparatus according to claim 1, wherein the mask is made from a metal.

6. The laser processing apparatus according to claim 1, further comprising a deforming lens for transforming a spot of a laser beam into an elliptical pattern before the laser beam emitted from the condensing lens is irradiated on the object.

7. The laser processing apparatus according to claim 6, wherein the deforming lens is implemented with a cylindrical lens.

8. The laser processing apparatus according to claim 6, wherein a long diameter of the elliptical spot is aligned in concordance with the processing direction of the object.

9. The laser processing apparatus according to claim 1, further comprising:
   a deforming lens for transforming a spot of the laser beam into an elliptical pattern before the laser beam emitted from the condensing lens is irradiated on the object,
   wherein the mask reflects the laser beam emitted from the rotational turning point of the mirror of the beam scanner around the hole before the laser beam emitted from the beam scanner is incident on the condensing lens.

10. The laser processing apparatus according to claim 1, further comprising:
    a deforming lens for transforming a spot of the laser beam into an elliptical pattern before the laser beam emitted from the mask is irradiated on the object,
    wherein the mask reflects the laser beam emitted from the rotational turning point of the mirror of the beam scanner around the hole, among laser beams emitted from the condensing lens, before the laser beam emitted from the condensing lens is irradiated on the object.

11. The laser processing apparatus according to claim 1, wherein the beam scanner is one of reflection devices using galvanometer scanners or servomotors.

\* \* \* \* \*